US009090964B2

United States Patent
Blackwell et al.

(10) Patent No.: US 9,090,964 B2
(45) Date of Patent: Jul. 28, 2015

(54) ADDITIVES TO IMPROVE THE PERFORMANCE OF A PRECURSOR SOURCE FOR COBALT DEPOSITION

(71) Applicant: INTEL CORPORATION, Santa Clara, CA (US)

(72) Inventors: James M. Blackwell, Portland, OR (US); Daniel B. Bergstrom, Lake Oswego, OR (US); Scott B. Clendenning, Portland, OR (US); Patricio E. Romero, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 14/134,087

(22) Filed: Dec. 19, 2013

(65) Prior Publication Data
US 2015/0176119 A1    Jun. 25, 2015

(51) Int. Cl.
| C23C 16/08 | (2006.01) |
| C23C 16/16 | (2006.01) |
| C23C 16/18 | (2006.01) |
| C23C 16/06 | (2006.01) |

(52) U.S. Cl.
CPC ..................................... *C23C 16/06* (2013.01)

(58) Field of Classification Search
CPC .......... C23C 16/08; C23C 16/16; C23C 16/18
See application file for complete search history.

(56) References Cited

U.S. PATENT DOCUMENTS

| 3,855,017 A * | 12/1974 | Schueler ...................... 148/105 |
| 4,095,904 A * | 6/1978 | Klein et al. .................... 356/427 |
| 6,984,591 B1 * | 1/2006 | Buchanan et al. ............. 438/778 |
| 2001/0049045 A1 * | 12/2001 | Hockaday et al. .............. 429/34 |
| 2007/0202254 A1 * | 8/2007 | Ganguli et al. ................ 427/252 |
| 2008/0069728 A1 * | 3/2008 | Attar et al. ....................... 422/58 |
| 2009/0053426 A1 * | 2/2009 | Lu et al. ......................... 427/540 |
| 2010/0062614 A1 * | 3/2010 | Ma et al. ........................ 438/785 |
| 2012/0199515 A1 * | 8/2012 | Peters et al. ................. 206/524.6 |
| 2012/0252207 A1 * | 10/2012 | Lei et al. ........................ 438/653 |

OTHER PUBLICATIONS

Choi, Eun-Mi, et al., "In situ fabrication of cobalt-doped SrFe2As2 thin films by using pulsed laser deposition with excimer laser". Applied Physics Letters 95, 062507 (2009), pp. 1-3.*
Kidosaki, Toru, et al., "Electrodeposited Cobalt-Iron Alloy Thin-Film for Potentiometric Hydrogen Phosphate-Ion Sensor". Journal of Sensor Technology, 2012, 2, 95-101.*
Chan, Calvin K., et al., "Incorporation of cobaltocene as an n-dopant in organic molecular films". Journal of Applied Physics 102, 014906 (2007), pp. 1-6.*

* cited by examiner

*Primary Examiner* — Bret Chen
(74) *Attorney, Agent, or Firm* — Blakey, Sokoloff, Taylor & Zafman LLP

(57) ABSTRACT

Methods of forming cobalt films utilizing a cobalt precursor comprising an additive are described. Those methods may include adding an additive to a cobalt precursor, wherein the cobalt precursor is located in an ampoule that is coupled with a deposition tool, and then forming a cobalt film using the cobalt precursor comprising the additive. Non-volatile decomposition products of the cobalt precursor are solubilized in the ampoule.

26 Claims, 4 Drawing Sheets

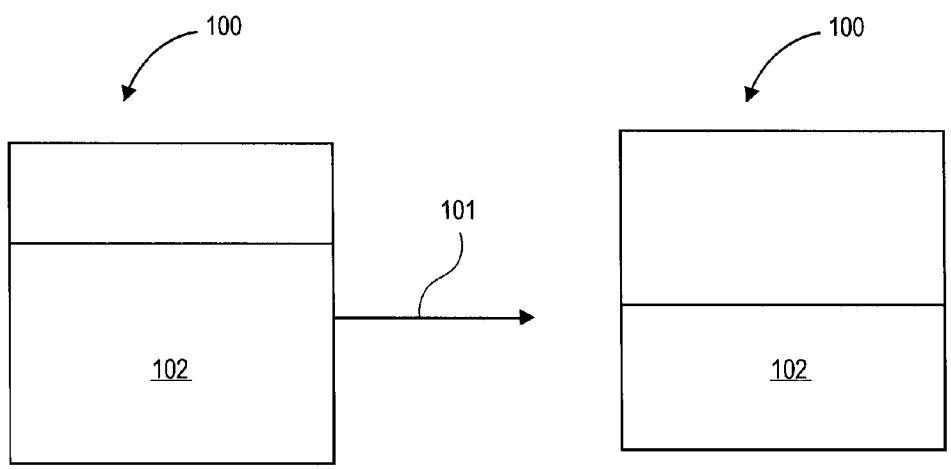
FIG. 1A  FIG. 1B

US 9,090,964 B2

ADDITIVES TO IMPROVE THE PERFORMANCE OF A PRECURSOR SOURCE FOR COBALT DEPOSITION

BACKGROUND OF THE INVENTION

Cobalt deposition may be used to fabricate interconnects for microelectronic devices, such as those which may be used in CMOS devices, for example. Cobalt precursors, such as those used in chemical vapor deposition (CVD) processes, may employ a delivery ampoule, wherein a cobalt precursor may be delivered to the tool during deposition of the cobalt film. In many cases, a sludge may be formed in the ampoule due to the decomposition of the cobalt precursor. The sludge may cause decreased deposition rates and impair liquid level sensors in the deposition tool, which decrease cobalt deposition stability.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

FIGS. 1a-1b represent cross-sectional views of structures according to embodiments.

DETAILED DESCRIPTION OF THE PRESENT INVENTION

Figure 2A:
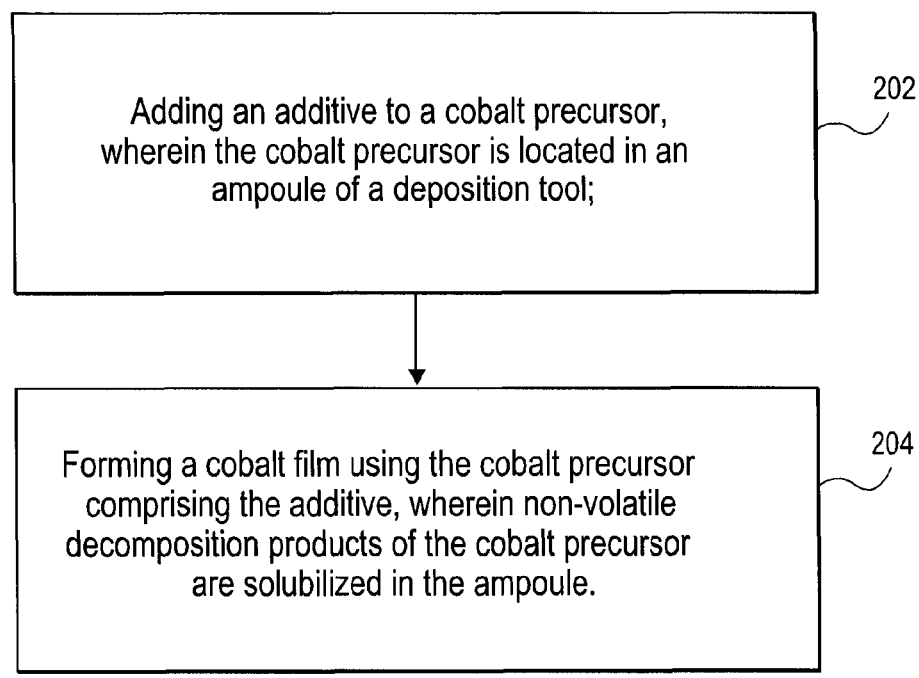
FIGS. 2a-2b represent flow charts of methods according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods of forming cobalt films utilizing a cobalt precursor comprising an additive are described. Those methods/ structures may include adding an additive to a cobalt precursor, wherein the cobalt precursor is located in an ampoule that is coupled with a deposition tool, and then forming a cobalt film using the cobalt precursor comprising the additive, wherein non-volatile decomposition products of the cobalt precursor are solubilized in the ampoule. The additives in the ampoule improve the performance of the cobalt precursor by eliminating sludge formation in the ampoule coupled with the deposition tool system, which increases the stability of the cobalt deposition process.

FIGS. 1a-1b illustrate cross-sectional views of an ampoule, such as may be used to deliver a cobalt precursor material to a deposition system, such as a CVD deposition system and/or an atomic layer deposition system, for example. The ampoule 100 may comprise/contain a cobalt precursor 102, such as a dicobalt hexacarbonyl complexed alkyne precursor (FIG. 1a). In another embodiment, the cobalt precursor 102 may comprise at least one of a tert-butylacetylenedicobalthexacarbonyl (CCTBA), a 2-hexynedicobalthexacarbonyl, and a isopropylacetylenedicobalthexacarbonyl cobalt precursor 102. In an embodiment, the ampoule 100 may further comprise an additive. The additive may comprise a low volatility liquid dispersant in an embodiment. The additive may be added to the ampoule 100 to avoid a sludge being formed in the ampoule 100 due to the decomposition of the cobalt precursor 102 after a cobalt deposition process 101 may be performed (FIG. 1b). In an embodiment, a cobalt film may be formed using the cobalt precursor comprising the additive, wherein non-volatile decomposition products of the cobalt precursor are solubilized in the ampoule 100.

Figures 3A, 3B:
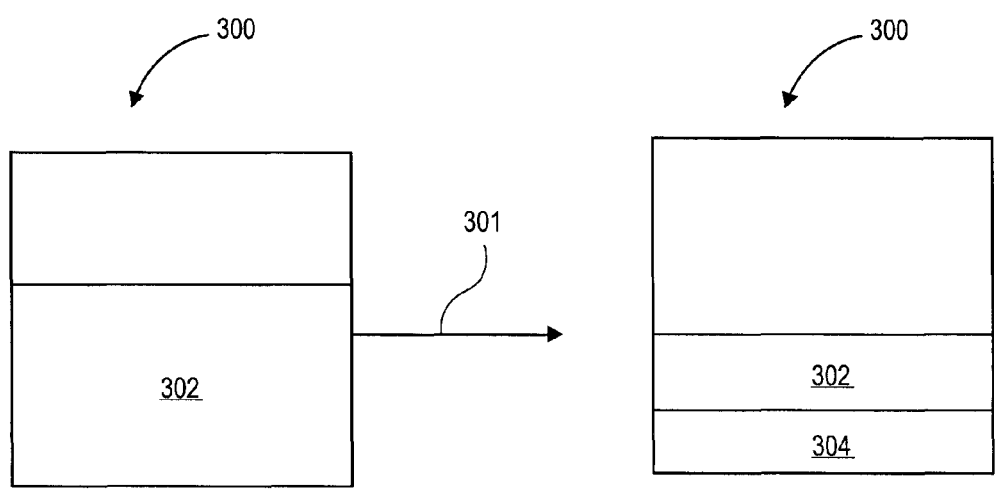
FIGS. 3a-3b represent cross-sectional views of structures according to the Prior Art.

The cobalt precursor may experience formation of lower volatility viscous liquids and solids upon being heated, which are commonly referred to as sludge. The sludge may appear in prior art ampoule's which do not contain the additive in the ampoule. For example, a prior art ampoule 300 may comprise a cobalt precursor 302 (FIG. 3a, Prior Art). After a cobalt deposition process 301 has been performed, a sludge 304 (viscous solids and liquids) may be formed in the ampoule 300 (FIG. 3b, Prior Art). The sludge 304 at the bottom of the ampoule 300 may cause waste, and interfere with the liquid level sensors of the delivery system of the deposition tool.

Referring back to FIG. 1a, the addition of additives to the precursor ampoule 100 decreases the rate of bimolecular and/or higher order decomposition mechanisms by diluting the cobalt precursor 102, as well as by solubilizing any eventual decomposition products that may appear due to the deposition process 101. Thus, the additive avoids sludge formation in the ampoule 100, and thereby enables the high volume manufacturing of CVD cobalt films. In an embodiment, the use of the additive causes the cobalt precursor 102 to remain a free flowing liquid. In an embodiment, a push gas may be used, wherein a gas may be bubbled through the ampoule 100 to lower the cobalt precursor ampoule temperature. Using the bubbler alone without the additive does not tend to remove enough sludge from the ampoule 100, since thermal decomposition and sludge formation still occurs, even at lower bubbler temperatures. Also, bubbling a push gas may accelerate loss of volatile decomposition products, and may accelerate sludge formation in the ampoule 100.

In an embodiment, the stabilized precursor ampoule 100 may consist of a charge of the cobalt precursor 102 along with the additive, which may comprise a low volatility liquid dispersant. The cobalt precursor 102 and its decomposition products are soluble in the additive. In an embodiment, the dispersant/additive may comprise about one to about 200 volume percent of the cobalt precursor 102. In an embodiment, the vapor pressure of the dispersant/additive may be such that the volume of the original dispersant/additive charge may not decrease by a significant amount. In an embodiment, the vapor pressure of the dispersant may decrease less than about 10 percent during the lifetime of the ampoule use.

In an embodiment, the low volatility liquid dispersant may comprise a long chain linear, branched or cyclic saturated hydrocarbon such as decane (C10) through eicosane (C20) a substituted arene, an alkyl halide, an alcohol, and ether, and organoamine, and/or a combination thereof. In another embodiment, the low volatility liquid dispersant may comprise an ionic liquid, such as imidazolium, and pyridinium cations, and tetrafluoroborate, hexafluorophosphate and bis-triflimide anions. In an embodiment, the stabilized precursor ampoule may comprise a charge of the cobalt precursor along with a liquid dispersant with a similar vapor pressure to that of the precursor and in which it and its decomposition products are soluble.

In an embodiment, both the cobalt precursor 102 and the dispersant/additive may be delivered out of the ampoule 100 in consistent amounts during regular use with the deposition tool. In an embodiment, the liquid dispersant additive may comprise a comparable volatility to the cobalt precursor 102. In an embodiment, the additive/dispersant may comprise a linear, branched and/or cyclic saturated hydrocarbon, a long chain and/or a cyclic internal alkyne or alkyne, a substituted arene, an alkyl halide, and alcohol, and ether, and organoamine, or a combination thereof. The cobalt precursor 102 and liquid dispersant additive can be charged and removed from the precursor ampoule via an automated liquid delivery system, in an embodiment. Pure dispersant additive can also be used to clean the ampoule 102 prior to the addition of a fresh charge of precursor 102 and dispersant.

In an embodiment, if the cobalt precursor is used neat, pure dispersant/additive can also be used to clean out the contents of the ampoule 100 by utilizing an automated liquid precursor delivery system. In an embodiment, the stabilized cobalt precursor 102 contained in the ampoule 100 may consist of a charge of the cobalt precursor 102 along with a solid dispersant/additive. In an embodiment, the solid additive may comprise interconnected channels, and may comprise a metal organic framework (MOF) solid additive. The inner walls of the channels of the MOF are chemically inert with respect to the cobalt precursor 102 molecule. The diameter of the inner walls may be commensurate with the molecular diameter of the cobalt precursor 102, such that the additive can easily penetrate and exit the cobalt precursor but does not have sufficient space to undergo unimolecular, bimolecular or higher order decomposition reactions. In an embodiment, the cobalt precursor 102 may comprise a solid precursor, wherein the additive is capable of lowering the melting point of the precursor and solubilizing the cobalt precursor 102.

Figure 2B:
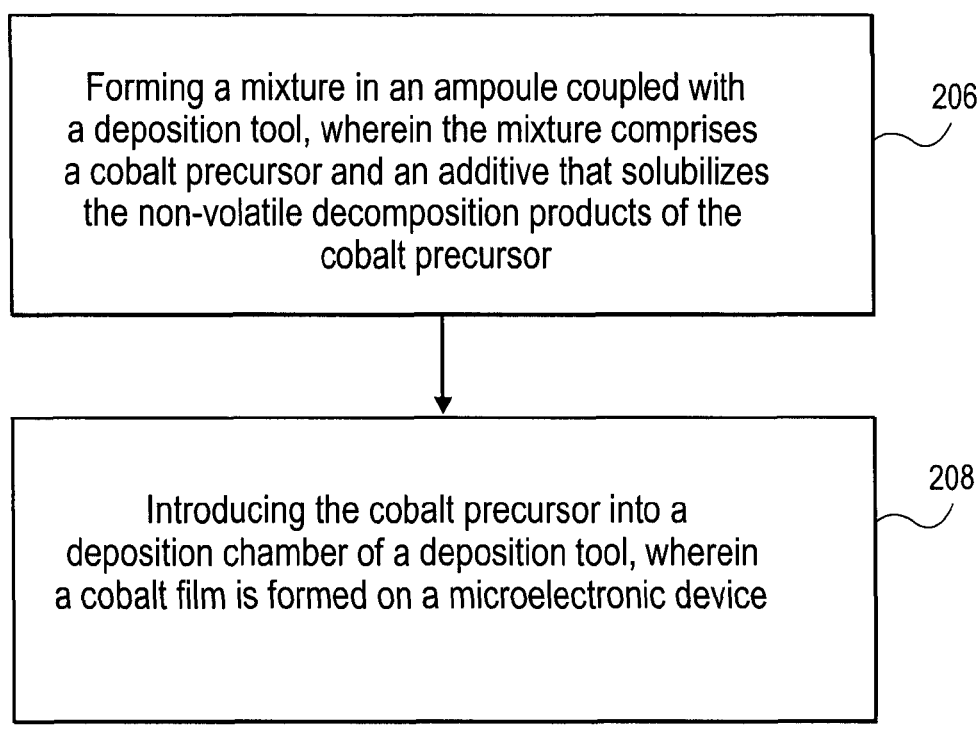

FIGS. 2a-2b depict flow charts according to embodiments. At step 202, an additive is added to a cobalt precursor, wherein the cobalt precursor is located in an ampoule of a deposition tool (FIG. 2a). At step 204, a cobalt film may be formed using the cobalt precursor comprising the additive, wherein non-volatile decomposition products of the cobalt precursor are solubilized in the ampoule. In FIG. 2b, at step 206, a mixture may be formed in an ampoule coupled with a deposition tool, wherein the mixture comprises a cobalt precursor and an additive that solubilizes the non-volatile decomposition products of the cobalt precursor. At step 208, the cobalt precursor may be introduced into a deposition chamber of a deposition tool, wherein a cobalt film is formed on a microelectronic device.

The embodiments herein improve the performance of cobalt precursor source materials through the addition of a low volatility dispersant/additives. For example, sludge formation is not observed when the cobalt precursor, which may comprise CCTBA, is dissolved in hexadecane low volatility dispersant, even after undergoing thermal stress. Additionally, the hexadecane dispersant does not significantly impact the CCTBA delivery. In an embodiment, the CCTBA may be vaporized between about 35 to about 45° C. The liquid dispersant/additives herein enable the cobalt precursor to remain a free flowing liquid within the ampoule, thus resulting in greater process stability and longer lifetime for ampoule usage with the deposition tool, which greatly increases throughput of the cobalt the deposition processing. The embodiments herein enable high-volume manufacturing of cobalt precursor usage for depositing cobalt films using such techniques as CVD. Embodiments enable manufacturing of interconnect structures for microelectronic device fabrication utilizing cobalt CVD tools.

Prior art ampoule implementation tends to lead to a loss of between about 20 to about 25 weight percent of the cobalt precursor in the form of a sludge. This sludge formation is a serious manufacturability issue since it causes decreased deposition rates and impairs the function of the ampoule liquid level sensors which are critical to process and tool stability for cobalt interconnect deposition processes. The embodiments enable the use of additives to improve the performance of the cobalt source precursor in the ampoule, by avoiding sludge formation that may occur due to precursor decomposition.

The cobalt deposition process 101 herein may be used to form such structures as interconnects that may be used in multilevel metallization processes for such microelectronic devices as metal oxide semiconductor field effect transistors (MOSFETs). Cobalt metal has also been used as a barrier material for an interconnect line such as a barrier for a copper interconnect (to inhibit migration of copper into an adjacent dielectric material). One application of the use of cobalt in the course of an integrated circuit process is a process for metallization of through-silicon vias (TSVs). TSVs may be utilized to produce three-dimensional integrated circuit chip arrangements and allow for die-to-die stacking such as, for example, stacking of dynamic random access memory (DRAM) on a microprocessor die (e.g., wide I/O memory configuration).

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and deposition tools that pertain to the practice of the embodiments. Thus the embodiments are not limited to the structures described herein.

What is claimed is:

1. A method of forming a cobalt thin film comprising:
    adding an additive to a cobalt precursor, wherein the cobalt precursor is located in an ampoule of a deposition tool; and
    forming a cobalt film using the cobalt precursor comprising the additive, wherein non-volatile decomposition products of the cobalt precursor are solubilized in the ampoule.

2. The method of claim 1 further comprising wherein the cobalt precursor comprises a dicobalt hexacarbonyl complexed alkyne precursor.

3. The method of claim 1 further comprising wherein the cobalt precursor comprises at least one of tert-butylacetylenedicobalthexacarbonyl (CCTBA), 2-hexynedicobalthexacarbonyl, and isopropylacetylenedicobalthexacarbonyl.

4. The method of claim 1 further comprising wherein the additive comprises a low volatility liquid dispersant that stabilizes the lifetime of the cobalt precursor in the ampoule.

5. The method of claim 4 further comprising wherein the cobalt precursor and decomposition products of the cobalt precursor are soluble in the additive.

6. The method of claim 4 further comprising wherein the low volatility liquid dispersant comprises at least one of a substituted arene, a long chain internal alkene, a long chain internal alkyne, a cyclic internal alkene, a cyclic internal alkyne, an alkyl halide, an alcohol, an ether, and an organoamine.

7. The method of claim 1 further comprising wherein the additive comprises about 1 to about 200 percent volume of the cobalt precursor.

8. The method of claim 1 further comprising wherein a volume of the additive decreases less than about 10 percent during a lifetime of ampoule use.

9. The method of claim 1 wherein the additive may comprise at least one of a linear, a branched and a cyclic long chain saturated hydrocarbon compound.

10. The method of claim 9 further comprising wherein at least one of a linear, a branched and a cyclic long chain saturated hydrocarbon compound comprises at least one of a C10 through a C20 compound.

11. The method of claim 1 further comprising wherein the additive comprises an ionic liquid.

12. The method of claim 11 further comprising wherein the ionic liquid comprises at least one of an imidazolium cation and a pyridinium cation, and a tetrafluoroborate anion, a hexafluorophosphate and a bistriflimide anion.

13. The method of claim 1 further comprising wherein the cobalt precursor and the additive are delivered out of the ampoule in consistent amounts during a cobalt deposition process.

14. The method of claim 1 further comprising wherein the additive is used to clean the ampoule prior to the addition of fresh precursor and additive in the ampoule.

15. The method of claim 1 further comprising wherein the additive comprises a solid dispersant comprising interconnected channels.

16. The method of claim 15 further comprising wherein the solid dispersant comprises a metal organic framework, wherein the inner walls of the channels are chemically inert to the cobalt precursor.

17. A method of depositing a cobalt film in a deposition tool comprising:
    adding an additive to a cobalt precursor, wherein the cobalt precursor is located in an ampoule coupled with the deposition tool; and
    forming the cobalt film in a deposition chamber using the precursor comprising the additive, wherein a sludge is not formed in the ampoule.

18. The method of claim 17 further comprising bubbling a gas through the ampoule during a cobalt deposition process.

19. The method of claim 17 further comprising wherein the cobalt precursor is a solid precursor, and wherein the additive is capable of lowering the melting point of the precursor and solubilizing the cobalt precursor.

20. The method of claim 17 further comprising wherein the additive is used to clean the ampoule by utilizing an automated precursor delivery system.

21. The method of claim 17 further comprising wherein the cobalt precursor comprises a dicobalt hexacarbonyl complexed alkyne, and wherein the additive comprises a low volatility liquid dispersant.

22. A method of forming a cobalt film, comprising:
    forming a mixture in an ampoule coupled with a deposition tool, wherein the mixture comprises a cobalt precursor and an additive that solubilizes the non-volatile decomposition products of the cobalt precursor; and
    introducing the cobalt precursor into a deposition chamber of a deposition tool, wherein a cobalt film is formed on a microelectronic device.

23. The method of claim 22 further comprising wherein the ampoule does not comprise a sludge material.

24. The method of claim 22 further comprising a bubbling system for bubbling a gas through the ampoule.

25. The method of claim 22 wherein the deposition tool comprises a chemical vapor deposition tool.

26. The method of claim 22 wherein the cobalt precursor comprises a dicobalt hexacarbonyl complexed alkyne cobalt precursor, and wherein the additive comprises a low volatility liquid dispersant.

* * * * *